US012772970B2

(12) United States Patent
Hori et al.

(10) Patent No.: US 12,772,970 B2
(45) Date of Patent: Oct. 27, 2026

(54) PEST CONTROL APPARATUS

(71) Applicant: TOHOKU UNIVERSITY, Sendai (JP)

(72) Inventors: Masatoshi Hori, Sendai (JP); Hiroshi Fuji, Suita (JP); Kazuhisa Yamamoto, Suita (JP)

(73) Assignee: TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 19/117,854

(22) PCT Filed: Jan. 10, 2024

(86) PCT No.: PCT/JP2024/000270
§ 371 (c)(1),
(2) Date: Apr. 2, 2025

(87) PCT Pub. No.: WO2024/150758
PCT Pub. Date: Jul. 18, 2024

(65) Prior Publication Data

US 2026/0123619 A1 May 7, 2026

(30) Foreign Application Priority Data

Jan. 10, 2023 (JP) ................................ 2023-001702

(51) Int. Cl.
*A01M 1/22* (2006.01)
*H01S 5/065* (2006.01)
*H01S 5/10* (2021.01)

(52) U.S. Cl.
CPC ........... *A01M 1/226* (2013.01); *H01S 5/0651* (2013.01); *H01S 5/1092* (2013.01); *A01M 2200/01* (2013.01)

(58) Field of Classification Search
CPC .................................................... A01M 1/226
USPC ........................................................ 43/132.1
See application file for complete search history.

(56) References Cited

U.S. PATENT DOCUMENTS

| | | | |
|---|---|---|---|
| 2017/0156304 A1 | 6/2017 | Hori et al. | |
| 2025/0008939 A1 * | 1/2025 | Fuji | A01M 1/226 |

FOREIGN PATENT DOCUMENTS

| | | | | |
|---|---|---|---|---|
| CN | 106719524 A | * 5/2017 | A01M 5/00 |
| CN | 108157347 A | 6/2018 | |
| CN | 111631202 A | * 9/2020 | A01M 1/04 |
| CN | 114128543 A | * 3/2022 | A01G 13/00 |
| CN | 115119814 A | * 9/2022 | A01M 1/04 |
| JP | H01-202233 A | 8/1989 | |
| JP | 2015-104359 A | 6/2015 | |
| JP | 6118239 B2 | 4/2017 | |

(Continued)

OTHER PUBLICATIONS

Tohoku University, Graduate School of Agricultural Science, Discovery That Application of Blue Light Kills Insects, 2014, in 4 pages.

(Continued)

*Primary Examiner* — Christopher P Ellis
(74) *Attorney, Agent, or Firm* — PROCOPIO, CORY, HARGREAVES & SAVITCH LLP

(57) ABSTRACT

A pest control apparatus is a pest control apparatus for killing an insect which is a target using light. The pest control apparatus includes a light source device and an irradiation member. The light source device emits a laser beam including blue. The irradiation member irradiates the target with the laser beam emitted from the light source device.

11 Claims, 11 Drawing Sheets

(56) References Cited

FOREIGN PATENT DOCUMENTS

| | | | | |
|---|---|---|---|---|
| JP | 6796514 B2 | 12/2020 | | |
| WO | WO-2023089945 A1 * | 5/2023 | .............. | A01M 1/00 |

OTHER PUBLICATIONS

International Search Report PCT/JP2024/000270 mailed Apr. 2, 2024.

* cited by examiner

PEST CONTROL APPARATUS

CROSS-REFERENCE TO RELATED APPLICATIONS

This application is US National Stage of International Patent Application PCT/JP2024/000270, filed on Jan. 10, 2024, which claims benefit of priority from Japanese Patent Application 2023-001702, filed on Jan. 10, 2023, the contents of both of which are incorporated herein by reference.

TECHNICAL FIELD

The present invention relates to a pest control apparatus.

The present application claims priority to Japanese Patent Application No. 2023-001702 filed in Japan on Jan. 10, 2023, the contents of which are incorporated herein.

BACKGROUND ART

PTL 1 discloses an insecticidal technique for exterminating a target (pest) using a blue beam. PTL 2 discloses a pest control apparatus using a light-emitting diode (LED) that emits the blue beam. According to the pest control apparatus using the light emitting diode, even a narrow place (for example, an inside of a food processing machine) where powder, dust, and the like are likely to accumulate and pests are likely to inhabit can be efficiently irradiated with the blue beam and the pests can be exterminated.

CITATION LIST

Patent Literature

PTL 1: JP6118239B

PTL 2: JP6796514B

SUMMARY OF INVENTION

Technical Problem

In the related art, it has been considered that a light emitting diode is optimal as a light source of the blue beam for killing an insect which is a target. However, considering an output intensity per one light emitting diode element, in order to secure the blue beam having an intensity effective for extermination of pests in a wide range such as a field, a cultivation facility, and a large-scale facility, an enormous number of light emitting diodes may be required. In addition, for example, as in a sewage facility, when a distance between an occurrence location of the pests and the light source is long, it may be difficult to deliver the blue beam having the effective intensity to the occurrence location of the pests with the output intensity of the light-emitting diode.

The invention has been made in view of such circumstances, and an object of the invention is to provide a pest control apparatus capable of killing an insect which is a target in a wide range.

Solution to Problem

In order to solve the above problem, a pest control apparatus according to an aspect 1 of the invention is a pest control apparatus for killing an insect which is a target using light, and the pest control apparatus includes a light source device configured to emit a laser beam including blue and an irradiation member configured to irradiate the target with the laser beam emitted from the light source device.

According to the aspect 1 of the invention, it is possible to kill an insect which is a target using laser beam having an intensity higher than an output intensity of a light emitting diode. Therefore, it is possible to provide a pest control apparatus capable of killing an insect which is a target in a wide range.

The pest control apparatus according to an aspect 2 of the invention is directed to the aspect 1, in which the light source device includes a multimode semiconductor laser.

The pest control apparatus according to an aspect 3 of the invention is directed to the aspect 1 or 2, in which the irradiation member is a scattering fiber that scatters the laser beam emitted from the light source device toward the target.

The pest control apparatus according to an aspect 4 of the invention is directed to any one of the aspects 1 to 3, in which the light source device is configured to emit a plurality of laser beams having different wavelengths.

The pest control apparatus according to an aspect 5 of the invention is directed to any one of the aspects 1 to 4, in which the light source device is configured to change a wavelength of the laser beam emitted from the light source device.

The pest control apparatus according to an aspect 6 of the invention is directed to any one of the aspects 1 to 5, further including a relay member configured to relay the laser beam emitted from the light source device to the irradiation member.

The pest control apparatus according to an aspect 7 of the invention is directed to any one of the aspects 1 to 6, in which the light source device is configured to emit a laser beam having a wavelength in a range of 370 nm to 500 nm.

The pest control apparatus according to an aspect 8 of the invention is directed to any one of the aspects 1 to 7, in which the light source device is configured to emit a laser beam having a wavelength in a range of 600 nm to 950 nm.

Advantageous Effects of Invention

According to the above aspects of the invention, it is possible to provide a pest control apparatus capable of killing an insect which is a target in a wide range.

DESCRIPTION OF EMBODIMENTS

Hereinafter, a pest control apparatus according to an embodiment of the invention will be described with reference to the drawings.

Figure 1:
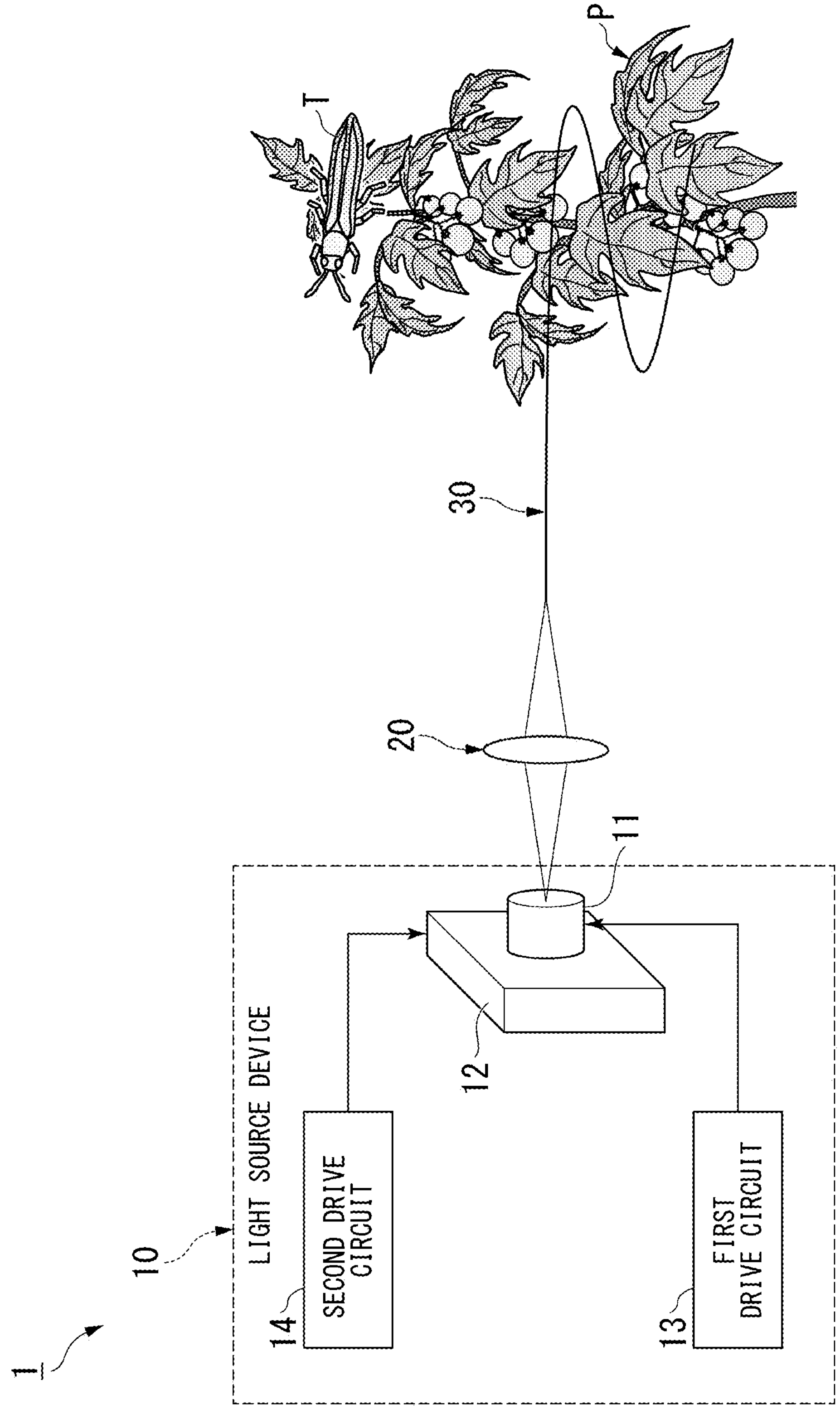
FIG. 1 is a diagram schematically showing a pest control apparatus according to an embodiment of the invention.

As shown in FIG. 1, a pest control apparatus 1 according to the present embodiment includes a light source device 10, a coupling member 20, and an irradiation member 30. The pest control apparatus 1 is an apparatus that kills an insect which is a target T using light. Examples of the target T include eggs, larvae, adults, and pupae of pests adhering to a plant P.

The light source device 10 includes a laser beam source 11, a cooling unit (cooling means) 12, a first drive circuit 13, and a second drive circuit 14. The laser beam source 11 emits a blue laser beam. The laser beam source 11 emits a laser beam having a wavelength in a range of, for example, 370 nm to 500 nm. As the laser beam source 11, for example, a multimode (more specifically, a so-called multi-transverse mode or transverse mode multi) semiconductor laser can be adopted. The first drive circuit 13 drives the laser beam source 11.

The cooling unit 12 cools the laser beam source 11. The cooling unit 12 according to the present embodiment is a Peltier element attached to the laser beam source 11. The Peltier element is an element in which a temperature gradient occurs when a current flows. The second drive circuit 14 drives the cooling unit 12, which is the Peltier element. The light source device 10 may include a control unit (not shown) that controls the drive circuits 13 and 14.

The light source device 10 may include a plurality of laser beam sources 11, or may include only one laser beam source 11. When the light source device 10 includes a plurality of laser beam sources 11, the cooling unit 12 may be individually provided for each laser beam source 11. Similarly, the drive circuits 13 and 14 may be individually provided for the laser beam sources 11 and the cooling unit 12. However, the plurality of laser beam sources 11 may be driven by the single first drive circuit 13, or the single cooling unit 12 may be provided for the plurality of laser beam sources 11. Similarly, a plurality of cooling units 12 may be driven by the single second drive circuit 14. That is, a correspondence among the laser beam source 11, the cooling unit 12, and the drive circuits 13 and 14 is freely selected.

The laser beam emitted from the light source device 10 is input to the coupling member 20. The coupling member 20 inputs the received laser beam to the irradiation member 30. That is, the coupling member 20 optically couples the laser beam source 11 and the irradiation member 30. When the laser beam emitted from the laser beam source 11 can be input to the irradiation member 30 with a sufficient intensity, the pest control apparatus 1 may not include the coupling member 20.

The irradiation member 30 irradiates the target T with the laser beam emitted from the light source device 10. More specifically, the irradiation member 30 changes a traveling direction of the linearly traveling laser beam. Accordingly, the irradiation member 30 expands a range irradiated with the laser beam to a predetermined range (for example, the plant P) in which generation of the target T is predicted. The irradiation member 30 according to the present embodiment is a scattering fiber that scatters the laser beam emitted from the light source device 10 toward the target T.

Specifically, the irradiation member 30, which is the scattering fiber, is formed of, for example, quartz glass or resin containing fine (for example, nano-sized) scattering particles. The laser beam is scattered by the scattering particles. The target T is irradiated with the scattered laser beam from a surface of the scattering fiber. The irradiation member 30, which is the scattering fiber, may include a core 30*a* and a cladding 30*b* (see FIG. 3A). The cladding 30*b* covers the core 30*a*. A refractive index of the cladding 30*b* is lower than a refractive index of the core 30*a*. Alternatively, the irradiation member 30, which is the scattering fiber, may include only the core 30*a* without including the cladding 30*b*.

Figure 2:
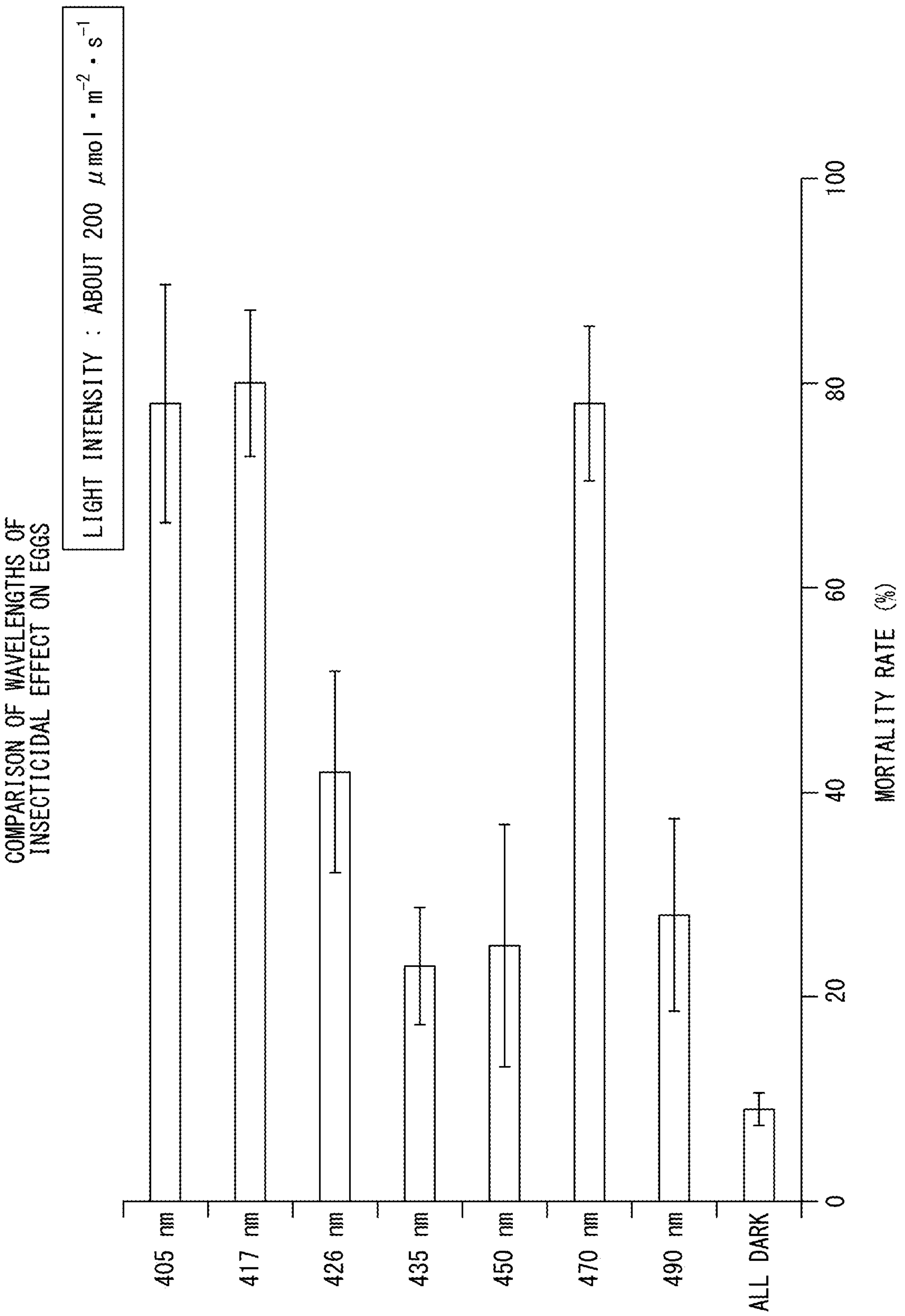
FIG. 2 is a graph showing wavelength dependency of an insecticidal effect on eggs of Frankliniella occidentalis.

An effective wavelength for killing an insect varies depending on a species and growth stage of the target T. FIG. 2 is a diagram showing results of an experiment in which an egg of Frankliniella occidentalis was selected as the target T and wavelength dependency of an insecticidal effect on the target T was examined. As shown in FIG. 2, for example, when the target T is the egg of Frankliniella occidentalis, it is possible to killing the target T efficiently by using a blue beam having a wavelength around 405 nm to 417 nm or a wavelength around 470 nm. Note that, "200 $\mu mol \cdot m^{-2} \cdot s^{-1}$" is a value indicating a light intensity. Specifically, "200 $\mu mol \cdot m^{-2} \cdot s^{-1}$" indicates that the number of photons emitted per unit area and unit time is 200 $\mu mol = 200 \times 10^{-6} \times N_A$ ($N_A$: Avogadro's constant).

Considering that the effective wavelength is different for each target T, it is preferable that the light source device 10 can emit a plurality of laser beams having different wavelengths. In other words, the light source device 10 preferably has a wavelength multiplexing configuration. According to this configuration, one light source device 10 can kill a plurality of species of targets T or targets T belonging to different growth stages. The light source device 10 may be capable of changing the wavelength of the laser beam emitted by the light source device 10. In other words, the light source device 10 may have a wavelength variable configuration. According to this configuration, it is possible to efficiently kill an insect by using an optimal wavelength according to the species or growth stage of the target T.

Hereinafter, examples of the light source device 10 having a wavelength multiplexing configuration and examples of the light source device 10 having a wavelength variable configuration will be described with reference to FIGS. 3A to 3D. Note that, in FIG. 3A and subsequent drawings, illustration of the cooling unit 12 and the drive circuits 13 and 14 is omitted for ease of understanding.

Figure 3A:
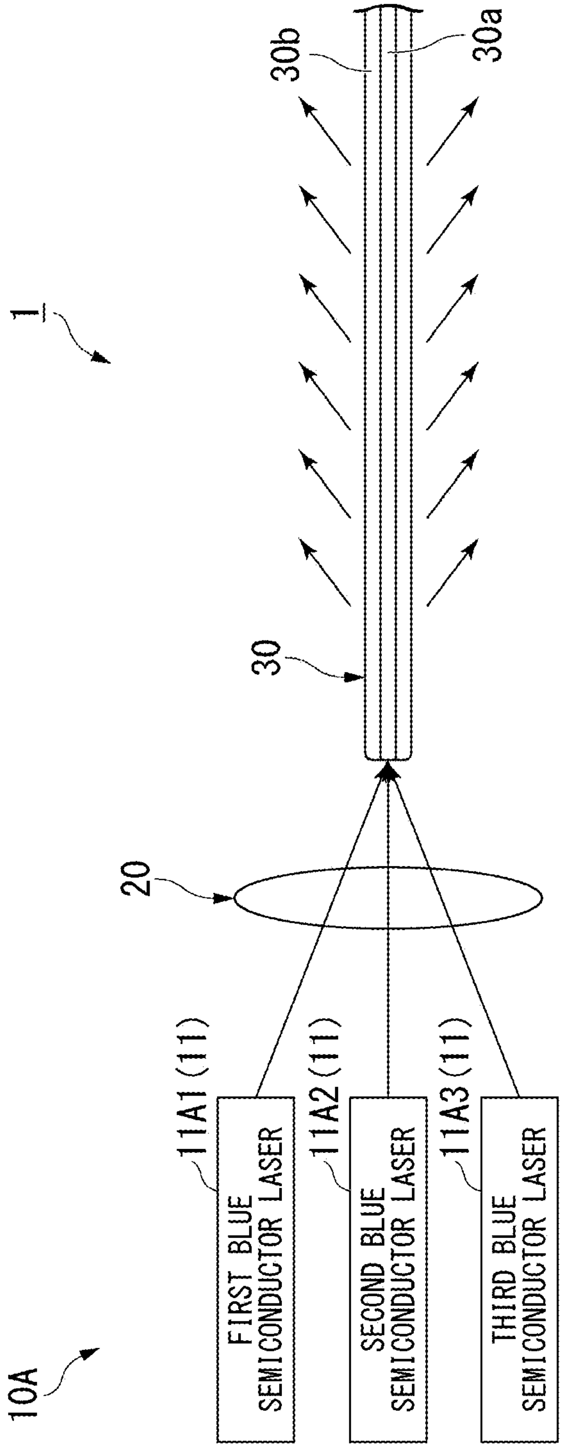
FIG. 3A is a diagram showing a first example of a light source device according to an embodiment of the invention.

A light source device 10A shown in FIG. 3A is the example of the light source device 10 having the wavelength multiplexing configuration. The light source device 10A includes three laser beam sources 11 including a first blue semiconductor laser 11A1, a second blue semiconductor laser 11A2, and a third blue semiconductor laser 11A3. The coupling member 20 optically couples the three blue semiconductor lasers 11A1 to 11A3 and the irradiation member 30.

Laser beams emitted from the three blue semiconductor lasers 11A1 to 11A3 have different wavelengths. For example, a wavelength of the laser beam emitted by the first blue semiconductor laser 11A1 is about 410 nm, a wavelength of the laser beam emitted by the second blue semiconductor laser 11A2 is about 430 nm, and a wavelength of the laser beam emitted by the third blue semiconductor laser 11A3 is about 470 nm.

According to this configuration, the target T can be irradiated with three laser beams having different wavelengths via the irradiation member 30. The number of laser beam sources 11 provided in the light source device 10A can be appropriately changed as long as the number is two or more.

Figure 3B:
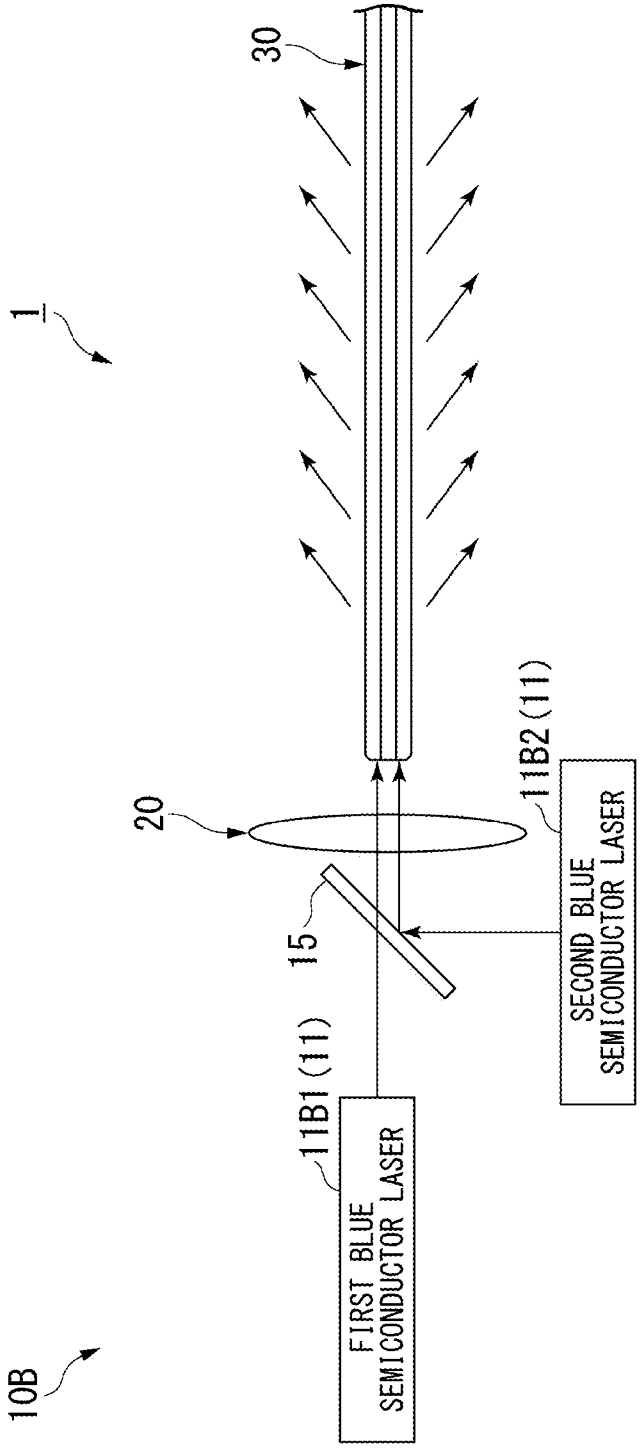
FIG. 3B is a diagram showing a second example of the light source device according to the embodiment of the invention.

A light source device 10B shown in FIG. 3B is the example of the light source device 10 having the wavelength multiplexing configuration. The light source device 10B includes two laser beam sources 11 including a first blue semiconductor laser 11B1 and a second blue semiconductor laser 11B2. Laser beams emitted from the two blue semiconductor lasers 11B1 and 11B2 have different wavelengths. For example, a wavelength of the laser beam emitted by the first blue semiconductor laser 11B1 is about 410 nm, and a wavelength of the laser beam emitted by the second blue semiconductor laser 11B2 is about 430 nm. The light source device 10B further includes a polarizing plate 15. The polarizing plate 15 is disposed in a state of being inclined with respect to an optical axis of the coupling member 20.

A polarization direction of the laser beam emitted from the first blue semiconductor laser 11B1 is different from a polarization direction of the laser beam emitted from the second blue semiconductor laser 11B2. Specifically, the first blue semiconductor laser 11B1 emits a polarized beam in a direction of being transmitted through the polarizing plate 15, and the second blue semiconductor laser 11B2 emits a polarized beam in a direction of being reflected by the polarizing plate 15.

According to this configuration, two types of laser beams emitted from the blue semiconductor lasers 11B1 and 11B2 are both incident on the irradiation member 30 through the coupling member 20. Therefore, the target T can be irradiated with two laser beams having different wavelengths via the irradiation member 30.

Figure 3C:
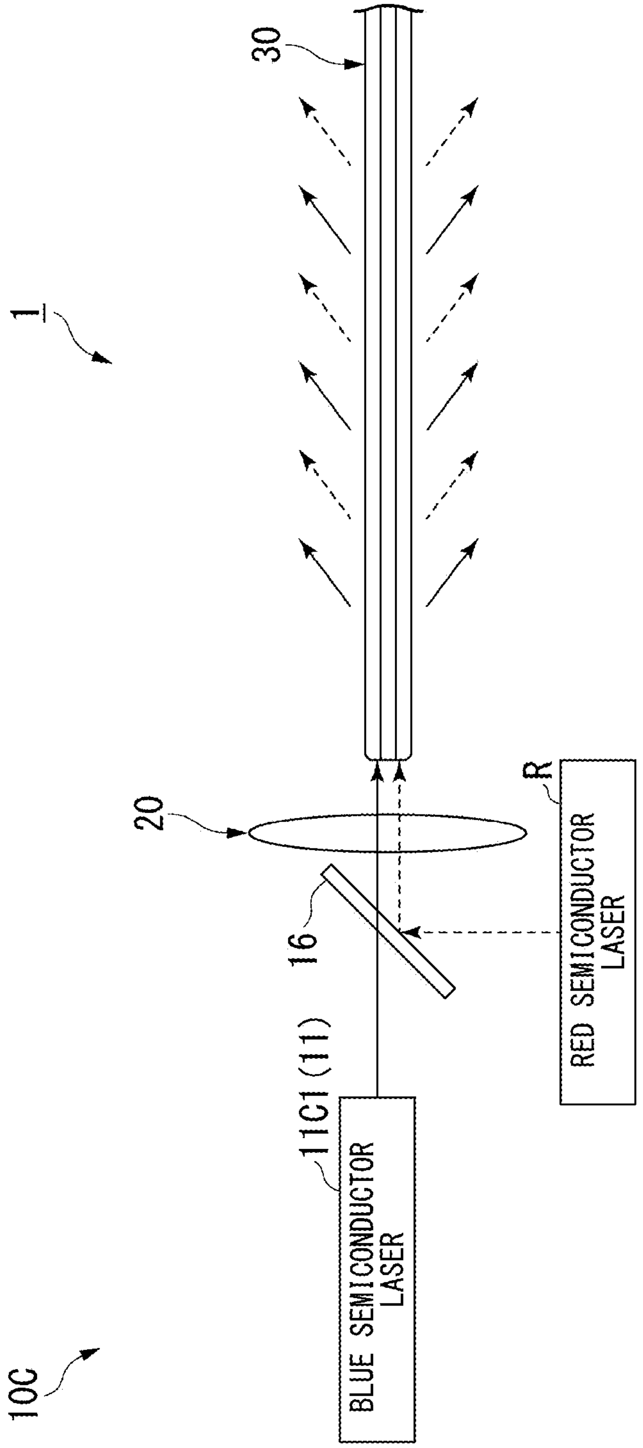
FIG. 3C is a diagram showing a third example of the light source device according to the embodiment of the invention.

A light source device 10C shown in FIG. 3C is the example of the light source device 10 having the wavelength multiplexing configuration. The light source device 10C includes a red semiconductor laser R in addition to the blue semiconductor laser 11C as the laser beam source 11. The light source device 10C further includes a flat wavelength filter 16. The wavelength filter 16 is disposed in a state of being inclined with respect to the optical axis of the coupling member 20.

The red semiconductor laser R emits a red laser beam unlike the laser beam source 11 that emits the blue laser beam. For example, the blue semiconductor laser 11C emits laser beam having a wavelength of about 410 nm, whereas the red semiconductor laser R emits laser beam having a wavelength of about 660 nm. The wavelength filter 16 allows the blue beam to transmit and reflects the red beam.

According to this configuration, both the blue laser beam and the red laser beam are incident on the irradiation member 30 through the coupling member 20. Therefore, it is possible to promote the growth of the plant P by the red laser beam while killing the target T by the blue laser beam. The wavelength of the laser beam emitted by the red semiconductor laser R is not limited to 660 nm. The wavelength of the laser beam emitted by the red semiconductor laser R may be, for example, in a range of about 600 nm to 950 nm.

Figure 3D:
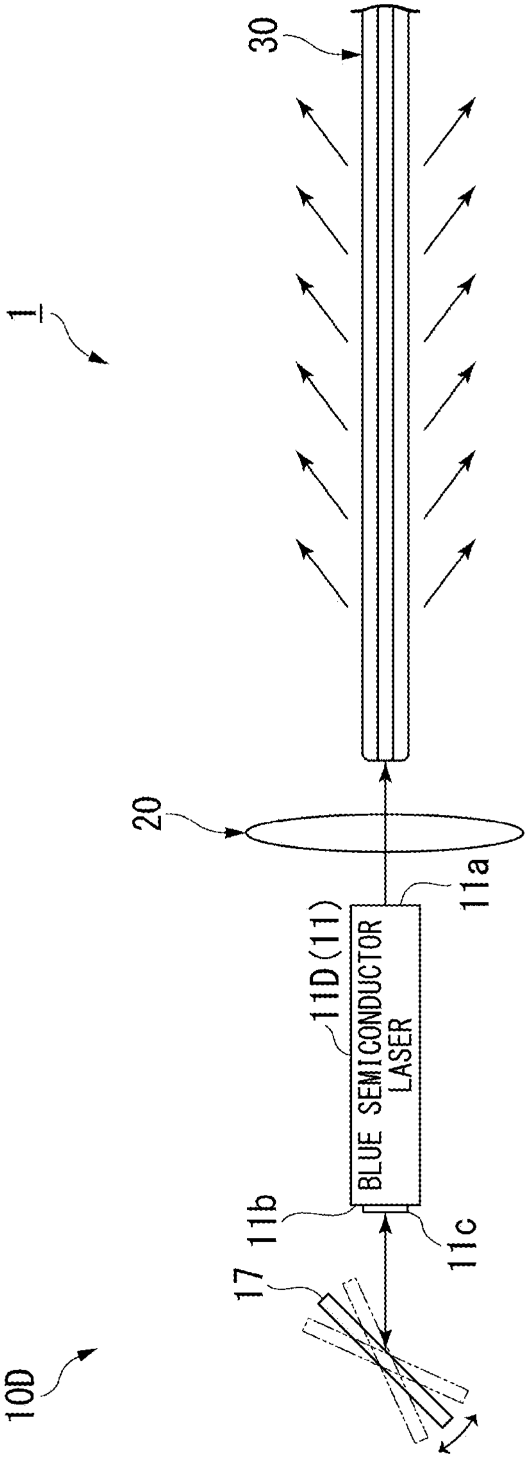
FIG. 3D is a diagram showing a fourth example of the light source device according to the embodiment of the invention.

A light source device 10D shown in FIG. 3D is the example of the light source device 10 having the wavelength variable configuration. The light source device 10D includes a diffraction grating 17 in addition to the blue semiconductor laser 11D as the laser beam source 11. The blue semiconductor laser 11D has an emission end 11*a* from which a laser beam is emitted and a rear end 11*b* located on a side opposite to the emission end 11*a*. The diffraction grating 17 faces the rear end 11*b* of the blue semiconductor laser 11D on the optical axes of the blue semiconductor laser 11D and the coupling member 20. An angle between the diffraction grating 17 and the optical axes of the blue semiconductor laser 11D and the coupling member 20 is variable.

Normally, the laser beam source 11 amplifies the beam inside by continuously reflecting the beam between the emission end 11*a* and the rear end 11*b*. When the beam reaches a certain intensity or more, the beam is emitted from the emission end 11*a*.

In contrast, in the blue semiconductor laser 11D of the light source device 10D, a reflectance of the rear end 11*b* is reduced. In other words, a reflection reduction portion 11*c* is provided at the rear end 11*b*. As a specific method for reducing the reflectance of the rear end 11*b* and providing the reflection reduction portion 11*c*, a method of coating the rear end 11*b* with a coating agent that contributes to the reduction of the reflectance can be adopted.

Since the reflection reduction portion 11*c* is provided at the rear end 11*b*, the beam is repeatedly reflected between the diffraction grating 17 and the emission end 11*a*. Here, the wavelength of the beam reflected (optically fed back) by the diffraction grating 17 toward the emission end 11*a* changes according to an angle formed by the diffraction grating 17 and the optical axis of the blue semiconductor laser 11D. That is, by adjusting the angle of the diffraction grating 17, the wavelength of the beam reflected and amplified (oscillated) between the emission end 11*a* and the diffraction grating 17 can be continuously changed. That is, the wavelength of the beam emitted from the emission end 11*a* can be continuously changed by adjusting the angle of the diffraction grating 17.

According to this configuration, by adjusting the angle of the diffraction grating 17, the wavelength of the laser beam emitted from the irradiation member 30 to the target T can be continuously changed. For example, when the blue semiconductor laser 11D that emits a laser beam having a wavelength of about 420 nm is used, the wavelength of the laser beam with which the target T is irradiated can be continuously changed within a range of about 410 nm to 430 nm by adjusting the angle of the diffraction grating 17.

The configurations of the light source devices 10A to 10D described above are merely examples. The configuration of the light source device 10 can be appropriately changed as long as the wavelength multiplexing configuration or the wavelength variable configuration can be implemented. For example, in the light source device 10B, the polarizing plate 15 may be replaced with a half mirror. However, when the half mirror is used, half of the laser beams emitted from the blue semiconductor lasers 11B1 and 11B2 is not incident on the irradiation member 30. Therefore, an energy loss occurs. The configurations of the light source devices 10A to 10D described above are preferable in that such energy loss can be prevented.

For example, the configuration of the light source device 10A and the configuration of the light source device 10D may be combined to implement the light source devices 10 having the wavelength multiplexing configuration and the wavelength variable configuration. For example, the laser beam source 11 that emits laser beams may be switched by controlling the first drive circuit 13 (see FIG. 1) in the light source devices 10A to 10C. Accordingly, the wavelength of the laser beam with which the target T is irradiated can be switched.

Next, the operation of the pest control apparatus 1 having the configuration described above will be described.

In the related art, an insecticidal technique of a target (pest) using the blue beam is known (for example, see PTL 1). In addition, it has been considered that a light emitting diode (LED) is optimal as a light source of the blue beam (for example, see PTL 2). However, considering an output intensity per one light emitting diode element, in order to secure the blue beam having an intensity effective for extermination of pests in a wide range such as a field, a cultivation facility, and a large-scale facility, an enormous number of light emitting diodes may be required. In addition, for example, as in a sewage facility, when a distance between an occurrence location of the pests and the light source is long, it may be difficult to deliver the blue beam having the effective intensity to the occurrence location of the pests with the output intensity of the light-emitting diode.

In view of the above problem, the inventors of the present application have studied the use of a laser beam that can be output with a higher intensity than the light emitting diode as the blue beam for killing the target T. Hereinafter, effectiveness of the laser beam in extermination of pests and the like (targets) will be described using specific experimental examples. The invention is not limited to the following experimental examples.

Figure 4:
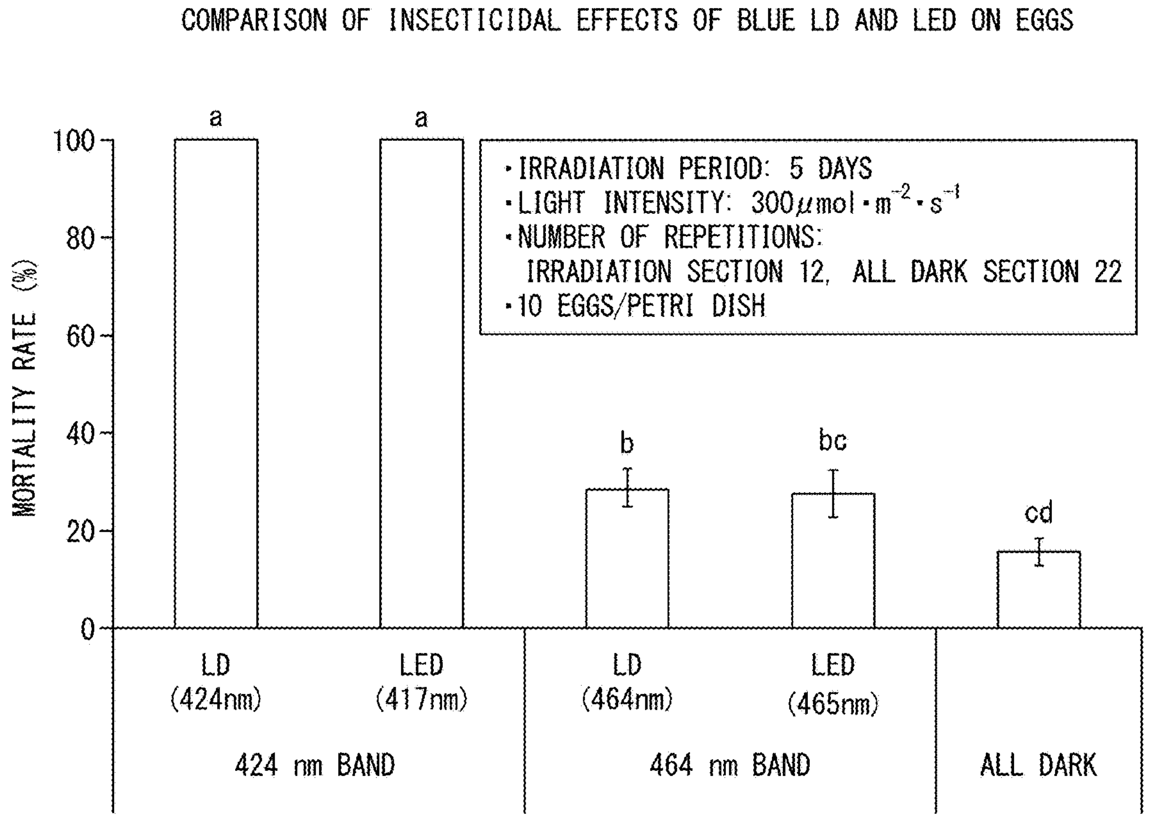
FIG. 4 is a diagram showing results of an experiment in which the insecticidal effects of a blue laser beam and a blue LED beam on the eggs of Frankliniella occidentalis were compared.

FIG. 4 is a diagram showing results of an experiment in which the insecticidal effects of the blue laser beam and the blue LED beam on eggs of Frankliniella occidentalis were compared. In FIG. 4, "Laser Diode (LD)" indicates the blue laser beam, and "LED" indicates a light emitting diode. In addition, an alphabet attached to an upper portion of a bar graph indicates a significant difference of the experimental result. That is, it is shown that there is no significant difference between mortality rates with the same alphabet ($\rho>0.05$, Steel-Dwass test). As shown in FIG. 4, it was found that the blue laser beam exhibited an insecticidal effect equivalent to that of the blue LED beam in both a 424 nm band and a 464 nm band.

It should be noted that "all dark" in the drawing indicates an observation result under dark conditions in which the target T is irradiated with neither the blue laser beam nor the blue LED beam. In addition, "irradiation period: 5 days", "repetition number: 12", and "10 eggs/petri dish" mean that an experiment in which 10 eggs are disposed in one petri dish and the petri dish is continuously irradiated with the blue beam for 5 days is repeated 12 times. These definitions are the same in the following drawings.

Figure 5:
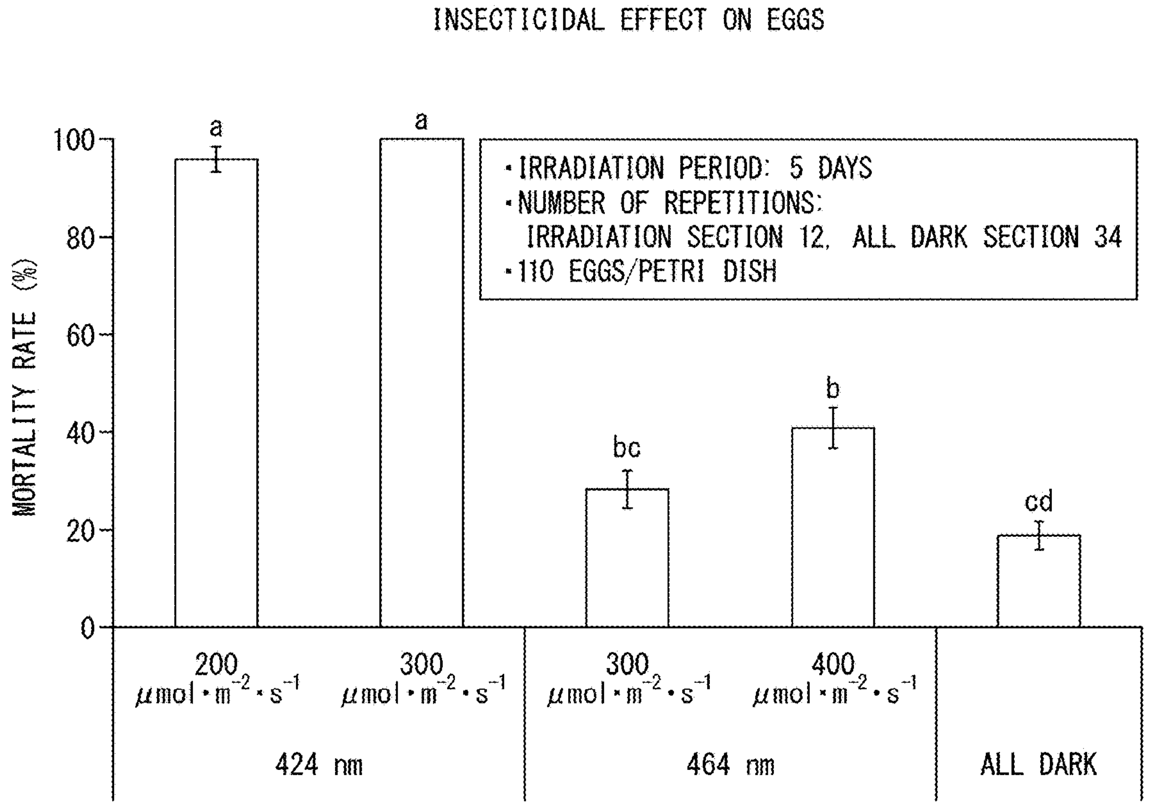
FIG. 5 is a diagram showing results of an experiment in which the insecticidal effect of the blue laser beam on the eggs of Frankliniella occidentalis was examined.

FIG. 5 is a diagram showing results of an experiment in which the insecticidal effect of the blue laser beam on the eggs of Frankliniella occidentalis was examined. In particular, it was found that irradiation with a laser beam of 424 nm at an intensity of 200 $\mu mol \cdot m^{-2} \cdot s^{-1}$ provides an insecticidal effect of 95% or more. In addition, it was found that the mortality rate of the eggs was improved by increasing the intensity of the laser beam for both the laser beam of 424 nm and the laser beam of 464 nm.

Figure 6:
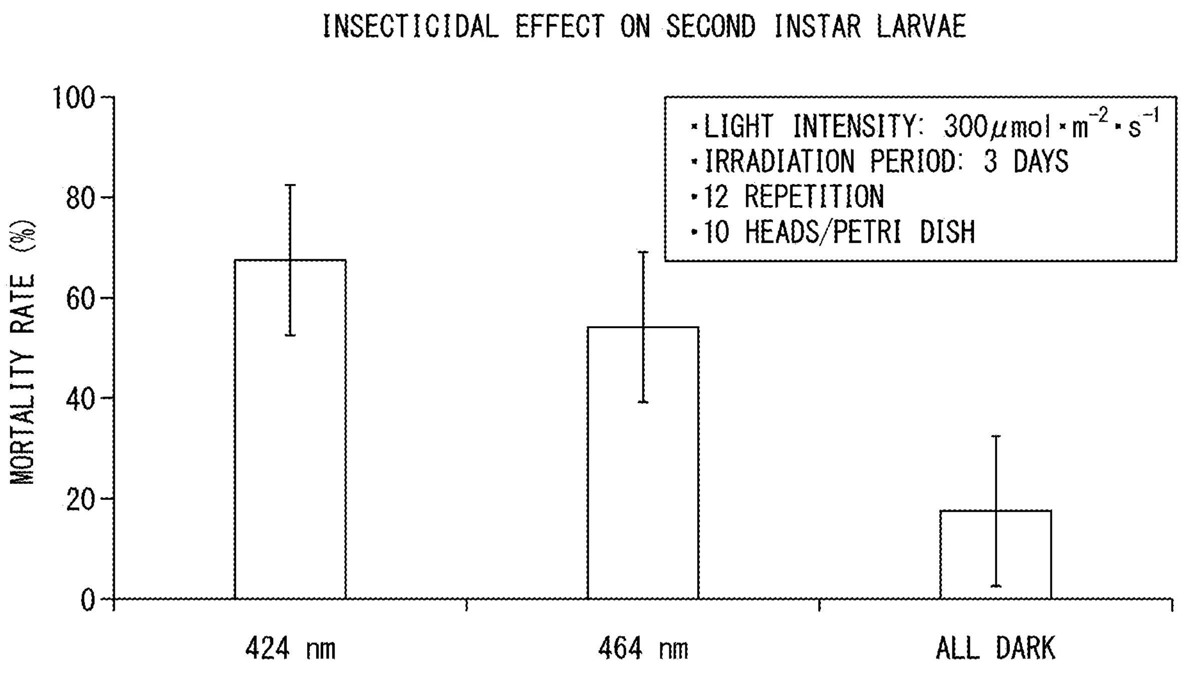
FIG. 6 is a diagram showing results of an experiment in which the insecticidal effect of the blue laser beam on second instar larvae of Frankliniella occidentalis was examined.

FIG. 6 is a diagram showing results of an experiment in which the insecticidal effect of the blue laser beam on second instar larvae of Frankliniella occidentalis was examined. It was found that a mortality rate of about four times that of an all dark condition can be implemented by the laser beam of 424 nm. In addition, it was found that a mortality rate of about three times that of the all dark condition can be implemented by the laser beam of 464 nm.

Figure 7:
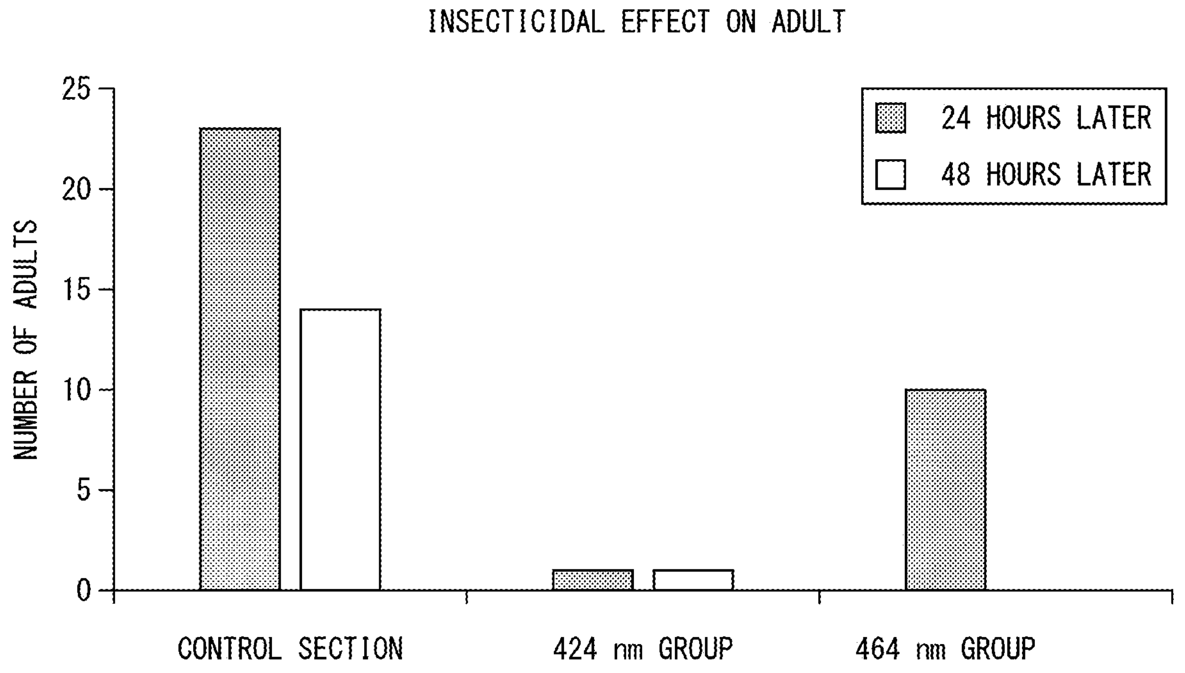
FIG. 7 is a diagram showing results of an experiment in which the insecticidal effect of the blue laser beam on adults of Aulacorthum solani was examined.

FIG. 7 is a diagram showing results of an experiment in which the insecticidal effect of the blue laser beam on adults of Aulacorthum solani was examined. A "control section" indicates an observation result under a white fluorescent lamp environment in which the blue laser beam is not emitted (the same applies to FIG. 8). On the other hand, in a section irradiated with the blue laser beam, the blue laser beam is emitted under the white fluorescent lamp environment. It was found that, when the adults were irradiated with the laser beam of 424 nm, most adults died 24 hours after a start of the irradiation. It was also found that some adults started to die after several hours of the irradiation (detailed illustration is omitted). It was found that, when the adults were irradiated with the laser beam of 464 nm, all adults died 48 hours after the start of the irradiation.

Figure 8:
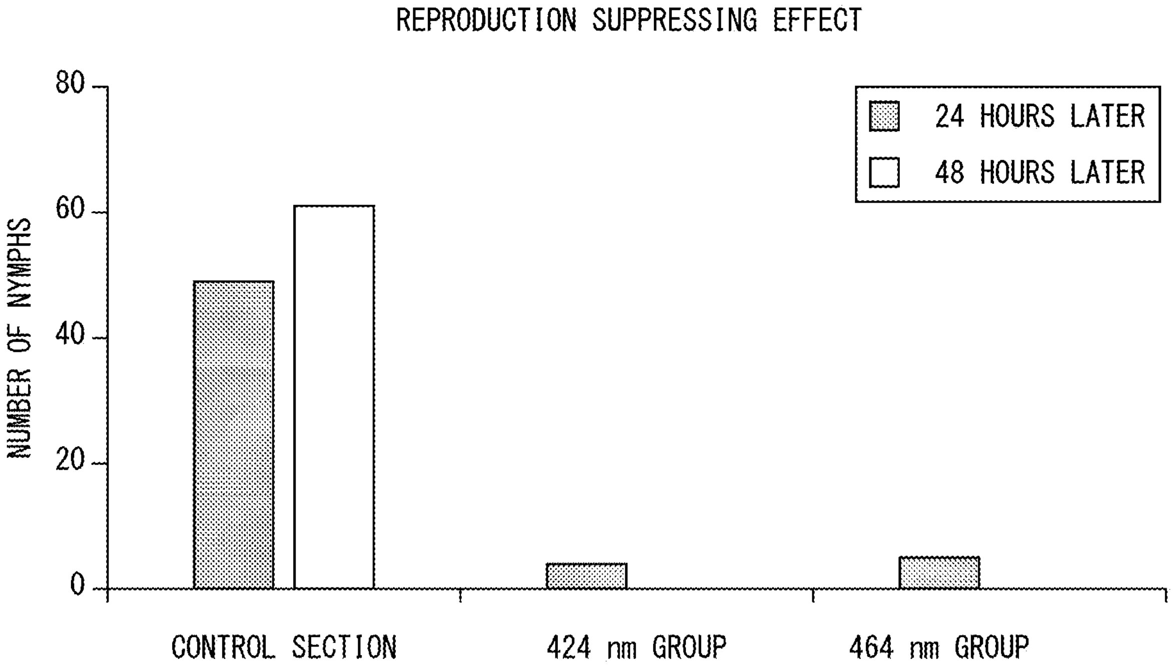
FIG. 8 is a diagram showing results of an experiment in which an effect of the blue laser beam on preventing reproduction of the Aulacorthum solani was examined.

FIG. 8 is a diagram showing results of an experiment in which an effect of the blue laser beam on preventing reproduction of the Aulacorthum solani was examined. As shown in FIG. 8, it was confirmed that in the control section not irradiated with the blue laser beam, nymphs of the Aulacorthum solani increased and the reproduction of the Aulacorthum solani occurred. On the other hand, it was found that when the laser beam of 424 nm was emitted, the number of nymphs decreased by 90% or more after 24 hours from the start of the irradiation as compared with the control section, and when the laser beam of 464 nm was emitted, the number of nymphs decreased by about 90% after 24 hours from the start of the irradiation as compared with the control section. In addition, it was found that 48 hours after the start of the irradiation, the number of nymphs became 0 in both cases of irradiation with the laser beam of 424 nm and irradiation with the laser beam of 464 nm.

As described above, the inventors of the present application have experimentally revealed that the blue laser beam exerts a pest control effect such as the insecticidal effect or a reproduction suppressing effect on the target T such as Frankliniella occidentalis or Aulacorthum solani.

In view of the above, the present embodiment proposes the light source device 10 that is a pest control apparatus for killing an insect which is the target T using light, and the pest control apparatus includes the light source device 10 configured to emit a laser beam including blue and the irradiation member 30 configured to irradiate the target T with the laser beam emitted from the light source device 10.

According to the light source device 10, it is possible to kill the target T using a laser beam having an intensity higher than the output intensity of the light emitting diode. Therefore, it is possible to provide the light source device 10 capable of killing the target T in a wide range. In addition, safety can be improved as compared with a case where an insect is killed using ultraviolet light such as UV-B light.

The irradiation member 30 may be a scattering fiber that scatters the laser beam emitted from the light source device 10 toward the target T. According to this configuration, the range irradiated with the laser beam can be flexibly set. For example, by disposing the scattering fiber so as to be wound around the plant P, the plant P, which is a three-dimensional object, can be uniformly irradiated with the blue beam.

The light source device 10 may be capable of emitting a plurality of laser beams having different wavelengths. According to this configuration, it is possible to kill a plurality of types of targets T having different effective wavelengths for killing an insect or targets T belonging to different growth stages. Further, according to the light source device 10 capable of emitting both the blue beam and the red light, it is also possible to perform both killing of the target T and promotion of the growth of the plant P.

The light source device 10 may be capable of changing the wavelength of the emitted laser beam. According to this configuration, it is possible to efficiently kill an insect by using an optimal wavelength according to the species or growth stage of the target T.

The technical scope of the invention is not limited to the above-described embodiment, and various modifications can be made without departing from the gist of the invention.

Figure 9:
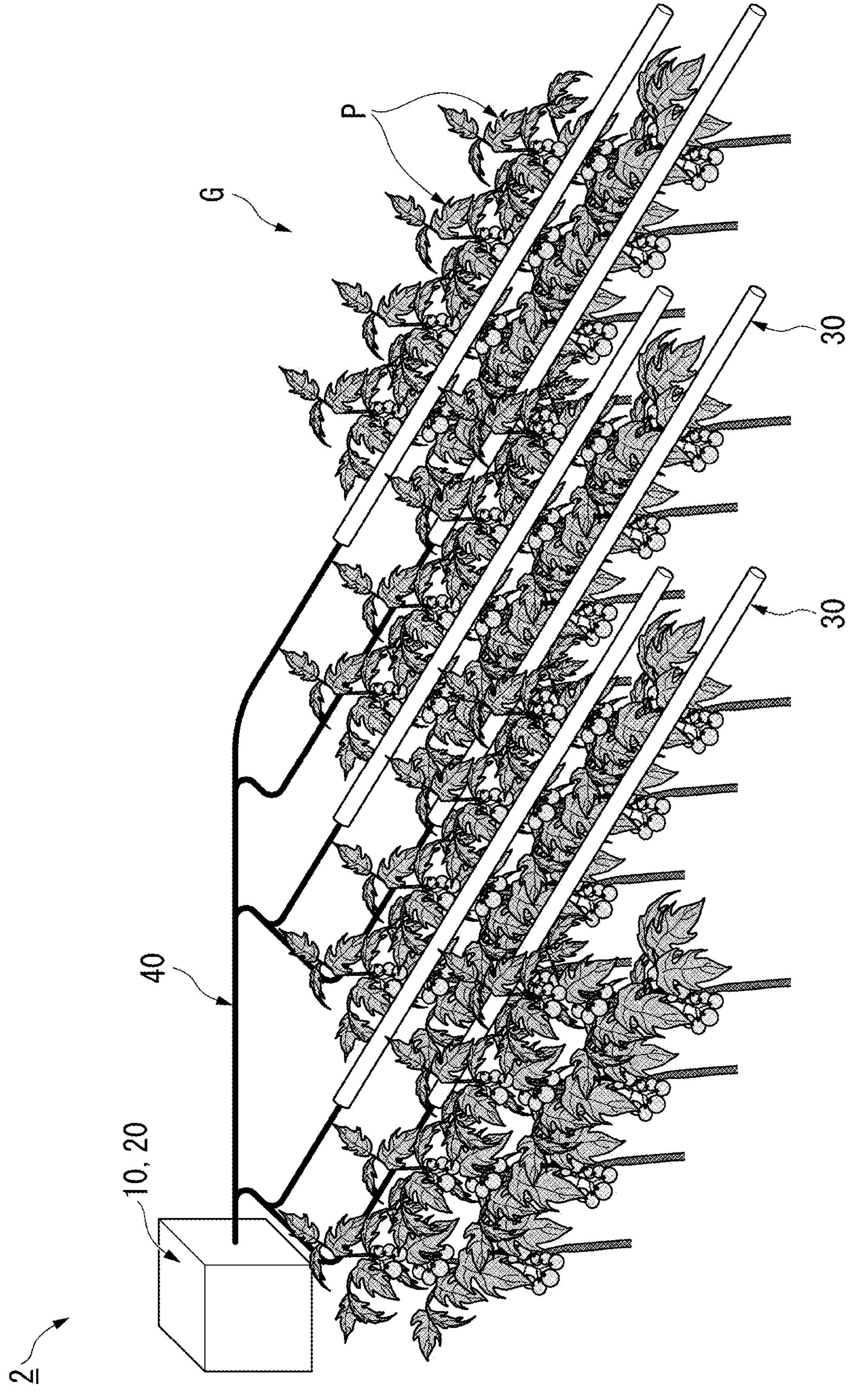
FIG. 9 is a diagram schematically showing a pest control apparatus according to a first modification of the invention.

FIG. 9 is a diagram schematically showing a pest control apparatus 2 according to a first modification of the invention. The pest control apparatus 2 according to the present modification includes a plurality of irradiation members 30. Further, the pest control apparatus 2 includes a relay member 40 in addition to the light source device 10, the coupling member 20, and the irradiation member 30. In the illustrated example, the plurality of irradiation members 30 are disposed in a group G having a plurality of plants P.

The relay member 40 relays the laser beam emitted from the light source device 10 to the irradiation member 30. Specifically, the relay member 40 according to the present modification is an optical fiber mechanically and optically connected to the irradiation member 30. The relay member 40 is optically coupled to the light source device 10 via, for r example, the coupling member 20. The configuration of the relay member 40 can be appropriately changed as long as the laser beam emitted from the light source device 10 can be relayed to the irradiation member 30.

According to the pest control apparatus 2 including the relay member 40, a distance between the light source device 10 and the plant P can be easily secured. Accordingly, for example, an adverse effect of heat generated by the light source device 10 on the growth of the plant P can be reduced. Unlike the irradiation member 30 that is the scattering fiber, the relay member 40 desirably does not contain scattering particles that scatter the laser beam. This is to prevent scattering of the laser beam by the relay member 40 and cause the laser beam to reach the irradiation member 30 and the target T while maintaining a sufficient intensity.

Figure 10:
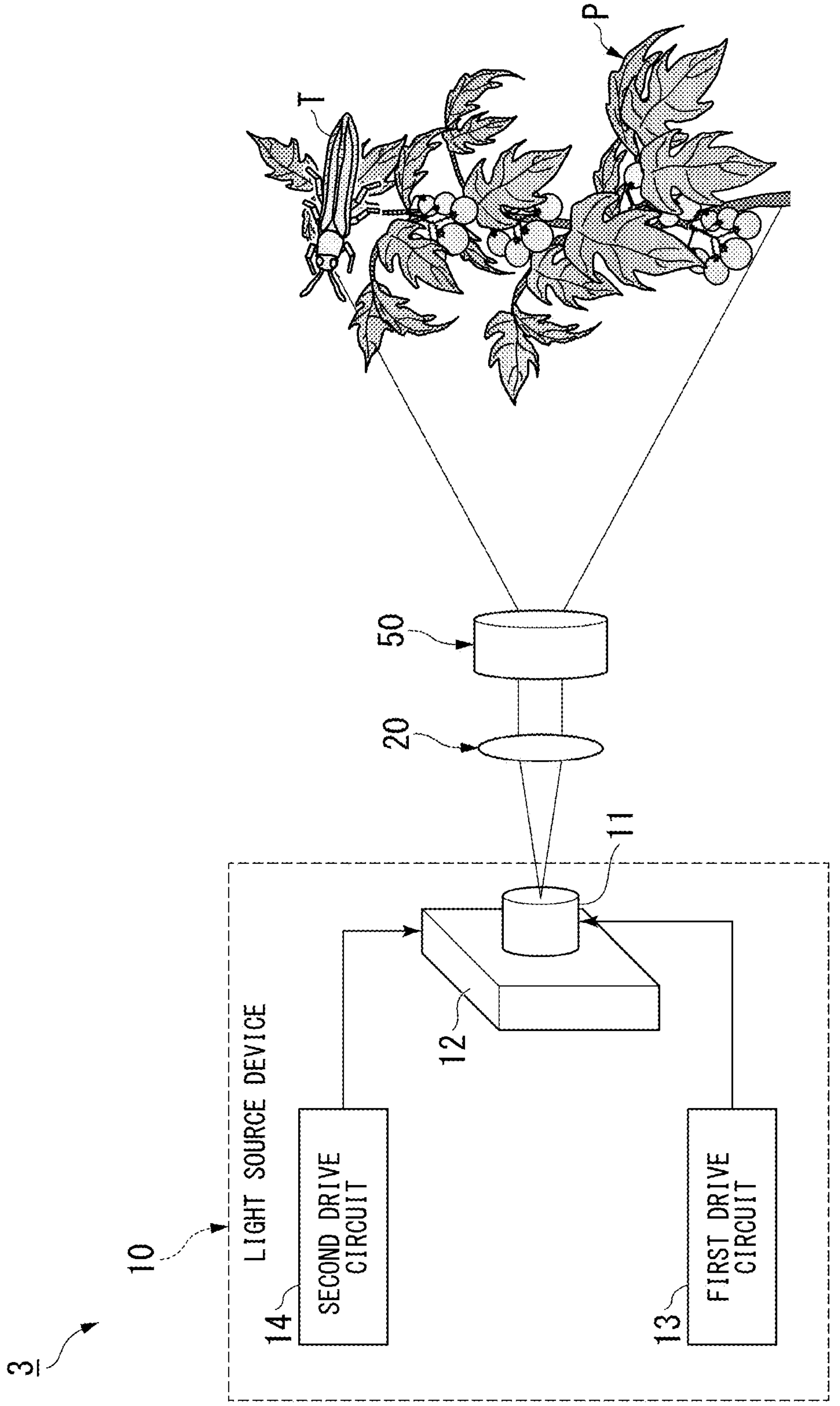
FIG. 10 is a diagram schematically showing a pest control apparatus according to a second modification of the invention.

FIG. 10 is a diagram schematically showing a pest control apparatus 3 according to a second modification of the invention. In the pest control apparatus 3 according to the present modification, an irradiation member 50 is a diffusion plate that diffuses the laser beam emitted from the light source device toward the plant P. Specifically, the diffusion plate according to the present modification is a plate-shaped member made of inorganic glass and having a finely processed surface. A diffusion plate using an organic material may be employed. However, the diffusion plate using the organic material may gradually deteriorate due to strong energy of the laser beam. Therefore, the diffusion plate is preferably formed of an inorganic material.

A single-mode semiconductor laser may be employed as the laser beam source 11. However, when the single-mode semiconductor laser is employed, there is a possibility that the laser beams interfere with one another and the irradiation of the blue beam becomes uneven. An output intensity of the single-mode semiconductor laser is lower than the output intensity of the multimode semiconductor laser. From the above viewpoint, it is preferable to adopt the multimode semiconductor laser as the laser beam source 11.

An element or a device other than the Peltier element may be adopted as the cooling unit 12. Although cooling performance is lower than that of the Peltier element, a cooling component (for example, a cooling fan) using a refrigerant such as water or air may be used as the cooling unit 12. An output of the laser beam source 11 decreases at a high temperature. Therefore, for example, when the laser beam source 11 is placed under sunlight irradiation, the light source device 10 preferably includes the cooling unit 12 such as the Peltier element. In a case where it is not necessary to cool the laser beam source 11, such as a case where the pest control apparatuses 1 to 3 are used to intermittently repeat a short irradiation time, the light source device 10 may not include the cooling unit 12. In addition, when an output light intensity of the laser beam source 11 is low, when the efficiency of the laser beam source 11 is high, or the like, the air-cooling type cooling unit 12 may be adopted, or the light source device 10 may not include the cooling unit 12.

The light source device 10 may have neither the wavelength multiplexing configuration nor the wavelength variable configuration.

In addition, it is possible to appropriately replace the constituent elements in the above-described embodiments with well-known constituent elements without departing from the gist of the invention, and the above-described embodiments and modifications may be appropriately combined.

REFERENCE SIGNS LIST

1, 2, 3: pest control apparatus
10: light source device
30, 50: irradiation member
40: relay member
T: target

What is claimed is:

1. A pest control apparatus for killing an insect, which is a target, using light, the pest control apparatus comprising:
- a light source device configured to emit a laser beam including blue; and
- an irradiation member configured to irradiate the target with the laser beam emitted from the light source device,
- wherein the irradiation member is a scattering fiber that scatters the laser beam emitted from the light source device toward the target.

2. A pest control apparatus for killing an insect, which is a target, using light, the pest control apparatus comprising:
- a light source device configured to emit a laser beam including blue; and
- an irradiation member configured to irradiate the target with the laser beam emitted from the light source device,
- wherein the light source device includes a multimode semiconductor laser.

3. The pest control apparatus according to claim 1, wherein
- the light source device is configured to emit a plurality of laser beams having different wavelengths.

4. The pest control apparatus according to claim 1, wherein the light source device is configured to change a wavelength of the laser beam emitted by the light source device.

5. The pest control apparatus according to claim 1, further comprising:

a relay member configured to relay the laser beam emitted from the light source device to the irradiation member.

6. The pest control apparatus according to claim 1, wherein the light source device is configured to emit a laser beam having a wavelength in a range of 370 nm to 500 nm.

7. The pest control apparatus according to claim 1, wherein the light source device is configured to emit a laser beam having a wavelength in a range of 600 nm to 950 nm.

8. The pest control apparatus according to claim 1, wherein the irradiation member is configured to scatter the laser beam without specifying a location of the target.

9. The pest control apparatus according to claim 1, wherein the irradiation member is configured to uniformly irradiate a plant in which generation of the target is predicted with the laser beam.

10. The pest control apparatus according to claim 1, wherein the light source device is configured to continuously emit the laser beam.

11. The pest control apparatus according to claim 10, wherein the light source device is configured to continuously emit the laser beam for 24 hours or longer.

* * * * *